(12) United States Patent
Tarsa et al.

(10) Patent No.: US 6,350,041 B1
(45) Date of Patent: Feb. 26, 2002

(54) HIGH OUTPUT RADIAL DISPERSING LAMP USING A SOLID STATE LIGHT SOURCE

(75) Inventors: Eric J. Tarsa, Goleta; Brian Thibeault, Santa Barbara, both of CA (US)

(73) Assignee: Cree Lighting Company, Goleta, CA (US)

( * ) Notice: Subject to any disclaimer, the term of this patent is extended or adjusted under 35 U.S.C. 154(b) by 0 days.

(21) Appl. No.: 09/537,531

(22) Filed: Mar. 29, 2000

Related U.S. Application Data
(60) Provisional application No. 60/168,818, filed on Dec. 3, 1999.

(51) Int. Cl.[7] .................................................. F21V 9/00
(52) U.S. Cl. ....................... 362/231; 362/293; 362/345; 362/246; 362/355
(58) Field of Search ................................ 362/231, 230, 362/293, 345, 246, 355, 311

(56) References Cited

U.S. PATENT DOCUMENTS

| | | | |
|---|---|---|---|
| 4,727,289 A | 2/1988 | Uchida | 315/71 |
| 5,140,220 A | 8/1992 | Hasegawa | 313/512 |
| 5,535,230 A | 7/1996 | Abe | 372/43 |
| 5,561,346 A | 10/1996 | Byrne | 313/512 |
| 5,581,683 A | 12/1996 | Bertignoll et al. | 385/146 |
| 5,688,042 A | 11/1997 | Madadi et al. | 362/240 |
| 5,850,126 A | 12/1998 | Kanbar | 315/200 A |
| 5,931,570 A | 8/1999 | Yamuro | 362/355 |
| 5,956,106 A * | 9/1999 | Petersen et al. | 349/64 |
| 5,959,316 A | 9/1999 | Lowery | 257/98 |

FOREIGN PATENT DOCUMENTS

| | | |
|---|---|---|
| DE | 4311937 A1 | 10/1994 |
| EP | 0936682 A1 | 8/1999 |
| GB | 1423011 | 1/1976 |

OTHER PUBLICATIONS

Nichia Corp Part Specification, *HIGH BRIGHTNESS LEDs*, (5–1999), pp. 1–3 (NSPW 300BS, NSPW 312BS, etc.).

* cited by examiner

*Primary Examiner*—Sandra O'Shea
*Assistant Examiner*—Ronald E. DelGizzi
(74) *Attorney, Agent, or Firm*—Koppel & Jacobs

(57) ABSTRACT

The invention provides a new solid state lamp emitting a light useful for room illumination and other applications. It comprises a solid state Light Source which transmits light through a Separator to a Disperser that disperses the light in a desired pattern and/or changes its color. In one embodiment, the Light Source is a blue emitting LED operating with current high enough for room illumination, the Separator is a light pipe or fiber optic device, and the Disperser disperses the light radially and converts some of the blue light to yellow to produce a white light mixture. The Separator spaces the Light Source a sufficient distance from the Disperser such that heat from the Light Source will not transfer to the Disperser when the Light Source is carrying elevated currents necessary for room illumination.

53 Claims, 6 Drawing Sheets

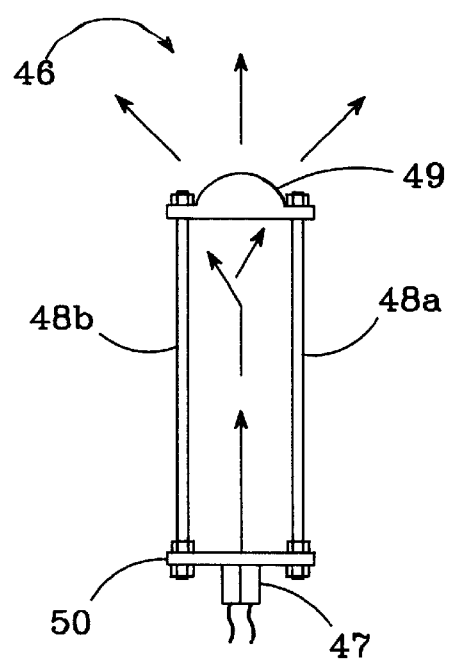
FIG.4
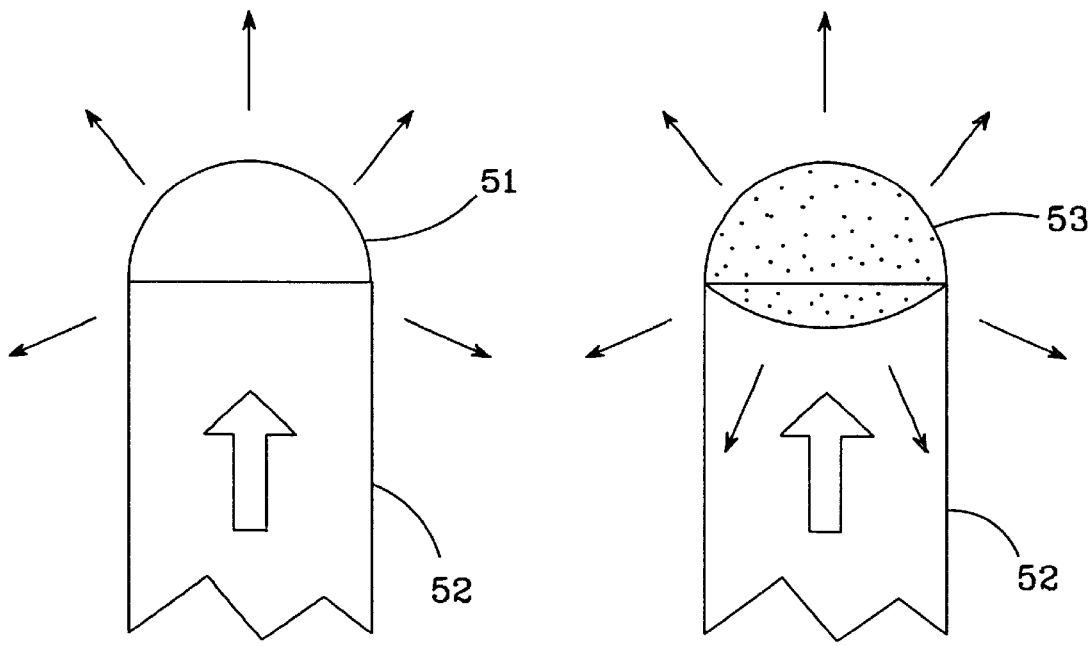
FIG.5a
FIG.5b

HIGH OUTPUT RADIAL DISPERSING LAMP USING A SOLID STATE LIGHT SOURCE

This application claims the benefit of provisional application No. 60/168,818 to Tarsa et al., which was filed on Dec. 3, 1999.

BACKGROUND OF THE INVENTION

1. Field of the Invention

This invention relates to lamps and more particularly to lamps using solid state devices as a light source.

2. Description of the Related Art

Conventional tungsten based lamps and indicator lights convert electrical current to light by applying a current to a filament, which causes it to glow. The filament is commonly suspended near the center of a glass bulb between two rigid current leads, which allows for a radial distribution of the light that is particularly useful for room illumination. The surface of the bulb can also be frosted to cause additional scattering of the light. The life-span of filament based lights is relatively short and is usually limited by the life-span of the filament or of the glass bulb. In addition, the filament is usually suspended close enough to the bulb surface that heat from the filament can cause the bulb to become very hot, such that it is painful to the touch or presents a danger of burning objects that come in contact with it.

Light emitting diodes (LEDs) are an important class of solid state devices that also convert electric energy to light. They generally comprise an active layer of semiconductor material sandwiched between two oppositely doped layers. When a bias is applied across the doped layers, holes and electrons are injected into the active layer where they recombine to generate light. Light is emitted omnidirectionally from the active layer and from all surfaces of the LED.

Most conventional LEDs are less efficient at converting current to light than filament lights, but recent advances in nitride based LEDs have resulted in highly efficient blue and green light sources. The efficiency of these LEDs has already surpassed that of filament based light sources, providing a light with equal or greater brightness in relation to its input power.

One disadvantage of conventional LEDs used for lighting applications is that they cannot generate white light from their active layers. One way to produce white light from conventional LEDs is to combine different colors from different LEDs. For example, white light can be produced by combining the light from red, green and blue LEDs or blue and yellow LEDs. One disadvantage of this approach is that it requires the use of multiple LEDs to produce a single color of light, increasing the overall cost and complexity. In addition, different colors of light are often generated from different types of LEDs and combining different LED types on one device can require complex fabrication. The resulting devices can also require complicated control electronics, since the different diode types can require different control voltages. The long term wavelength and stability is also affected by the different aging behaviors of the different LEDs and the miniaturization of the multi-LEDs is limited.

More recently, the light from a single blue emitting LED has been converted to white light by surrounding the LED with a yellow phosphor, polymer or dye. [See Nichia Corp. white LED, Part No. NSPW300BS, NSPW312BS, etc.; See also U.S. Pat. No. 5,959,316 to Hayden, "Multiple Encapsulation of Phosphor-LED Devices"]. The surrounding material "downconverts" the wavelength of at least some of the LED light, changing its color. For example, if a nitride based blue emitting LED is surrounded by a yellow phosphor, some of the blue light will pass through the phosphor without being changed while the remaining light will be downconverted to yellow. The LED will emit both blue and yellow light, which combines to provide a white light.

However, conventional blue LEDs are too dim for many lighting applications currently using filament based lamps or indicators, and when used to produce white light, some of the emitted light can be absorbed by the downconverting material. For blue LEDs to emit an output light flux sufficient for room illumination, the current applied to the LED must be increased. LEDs commonly operate from a current of 20–60 mAmps, which must be increased to greater than 1 Amp for the LED to illuminate a room. At this current level, LEDs become very hot and can cause damage to other objects and present a danger of fire or injury. The heat can also damage the LED chip itself, or degrade nearby downconverting media such as phosphors, fluorescent polymers, or fluorescent dyes. This can reduce the LED's downconverting ability and decrease its useful lifetime.

Another disadvantage of most conventional LEDs is that they are seated in a "metal cup", with the n-type layer typically at the bottom of the cup and the p-type surface directed up, with the entire device encased in a clear epoxy. When a blue emitting LED is used for generating white light, it is surrounded by a downconverting material before being encased in the clear epoxy. The cup has two conductive paths to apply a bias across the contacts on the p and n-type surfaces, which causes the LED to emit light. The cup also reflects light emitted from the LED's bottom n-type or side surfaces, back in the direction of the p-type upper surface where it adds to the light emitted from the LED. However, this reflection also causes the light source to be highly directional, so that it is brightest when viewed from directly above the LEDs emitting surface. Furthermore, this conventional LED emits light that appears a different color when viewed from different angles. This is due to incomplete mixing and randomization of the light rays of different colors. This type of light is not useful for room illumination or other applications requiring a dispersed light source or uniform color illumination.

To overcome this limitation, various LED lamps have been developed which use multiple directional LEDs arranged to provide a radial type light source. [See U.S. Pat. No. 5,688,042 to Abolfazl et al., U.S. Pat. No. 5,561,346 to Byrne, U.S. Pat. No. 5,850,126 to Kanbar, and U.S. Pat. No. 4,727,289 to Uchida]. However, because these lamps rely on multiple LEDs, their cost and complexity is increased. Also, they can only provide one pattern for dispersing the light. U.S. Pat. No. 5,931,570 to Yamura discloses a light emitting diode lamp in which the LED is embedded in one end of an epoxy bulb shaped body with the LED leads extending from the bulb end. The body also has a convex top that is frosted to disperse light from the LED. One disadvantage of this LED lamp is that it is not capable of producing white light without being combined with additional LEDs of different colors. In addition, if current were supplied to the LED for room illumination, the LED would become dangerously hot and could be damaged. Also, the lamp can only diffuse the light in one pattern that is hemispheric at best. Very little light is visible if the lamp is viewed from the its back side.

Solid state semiconductor lasers convert electrical energy to light in much the same way as LEDs. They are structurally similar to LEDs but include mirrors on two opposing surfaces, one of which is partially transmissive. In the case or edge emitting lasers, the mirrors are on the side surfaces; the mirrors provide optical feedback so that stimulated emission can occur. This stimulated emission provides a highly collimated/coherent light source. A vertical cavity laser works much the same as an edge emitting laser but the mirrors are on the top and the bottom. It provides a similar collimated output from the its top surface.

Solid state lasers can be more efficient than LEDs at converting electrical current to light, but their coherent light output is not useful for lamps because it only illuminates a small area. Also, they cannot efficiently produce green or blue light and their relatively small beam areas makes it impractical to combine the output of multiple different colored lasers.

SUMMARY OF THE INVENTION

The present invention provides a new solid state lamp that can disperse light in many patterns, but is particularly applicable to a radial dispersion of white light that is useful for room illumination. The new lamp consists of a separator/light transport medium ("Separator") with a light source at one end and a light dispersing/frequency converting element ("Disperser") at the other end. The new lamp can also have an enclosure to protect the three primary components and/or to provide additional dispersion or conversion capabilities.

The light source consists of at least one solid state light emitting device such as solid state LEDs or solid state semiconductor lasers, with some or all of the light directed down the Separator. When using more than one LED or laser, the devices can emit light with either similar or different wavelengths, depending on the intended application. For example, blue and yellow emitting LEDs can be used together to produce white light. The light source can incorporate additional components to aid in thermal management and electronic power management and can also include light reflecting or focusing elements. It can be contained within an enclosure such as the traditional screw socket end of a tungsten bulb to provide for heat and/or power transfer to the outside environment.

The Separator provides physical separation between the light source and the Disperser and also guides light from the light source to the Disperser. If desired, the Separator can actively shape, collimate, disperse, and/or actively guide the light from the light source to the Disperser. The Separator can contain materials that convert the wavelength of some or all of the light, or scatter or focus the light into specific patterns. It can also incorporate solids, liquids, or gases, to further interact with the light.

The Disperser is spaced from the light source by the Separator and serves primarily to disperse the light from the light source. It may also modify the wavelength of light from the source by including one or more converting materials which absorb some or all of the incident light and re-emit light of different wavelength. In one embodiment, the Disperser is the hemispheric shaped end of the Separator with a roughened surface for light scattering. It can also be removable to allow for the use of different Dispersers and can include a variety of optical components to shape the light such as lenses, reflectors, granules, holographic elements, or microspheres. A mask or reflector may be used to provide a more directional or controlled light distribution, or patterned illumination such as a company logo or sign.

The separation between the light source and the Disperser gives the new lamp a number of advantages and allows for flexibility in converting light from the light source into useful room illumination. The Disperser can take many different shapes to provide different light dispersions patterns, such as a uniform radial distribution. When operating at elevated current levels, the majority of the heat generated by the light source will be dissipated prior to reaching the Disperser. This prevents the Disperser from becoming dangerously hot and damaging any converting materials it may contain. The separation permits bulky thermal elements, such as heat sinks or heat fins as well as electronic components, to be placed near, or attached directly to, the Light Source without interfering with the light distribution. Accordingly, the separation allows a solid state light source, operating at elevated current levels, to safely and efficiently provide light useful for room illumination.

Compared to filament based lamps, the new lamp is more robust, lasts longer and in the event of failure or damage portions of the lamp can be replaced, without having to replace the entire lamp. For example, a Disperser containing downconverting materials such as fluorescent dyes, phosphors, or polymers, will generally have a shorter lifetime than the light source, and the ability to replace the Disperser by itself provides a significant cost savings.

These and other further features and advantages of the invention will be apparent to those skilled in the art from the following detailed description, taken together with the accompanying drawings, in which:

BRIEF DESCRIPTION OF THE DRAWINGS

FIG. 4 is a sectional view of another embodiment of the new lamp in which rods provide the separation between the light source and the Disperser;

FIGS. 5a through 5e are sectional views of different embodiments of the Disperser that can be used with the new lamp.

DETAILED DESCRIPTION OF THE INVENTION

Figure 1:
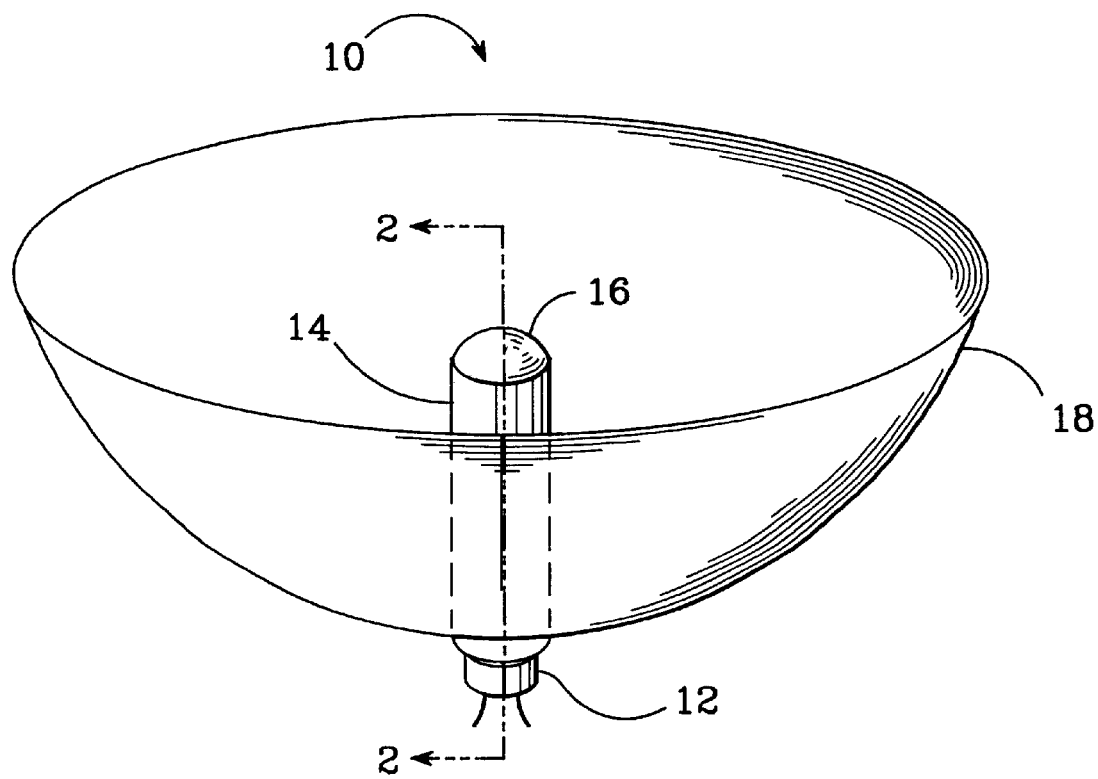
FIG. 1 is a perspective view of a new solid state lamp in accordance with the invention, with a lamp enclosure.

FIG. 1 shows one embodiment of a solid state lamp constructed in accordance with the invention. The lamp 10 consists of a light source 12, a Separator 14, a Disperser 16, and it can also have a lamp enclosure 18. The light source 12 is mounted at one end of the Separator 14 such that at least some of its light is directed along the Separator 14, to the Disperser 16. The new lamp 10 is particularly useful with solid state light sources such as LEDs or solid state semiconductor lasers but other sources can be used such as organic light emitting elements, fluorescent polymers, fluorescent dyes, and phosphors. The Separator 14 is elongated and primarily serves to separate the light source 12 from the Disperser 16. It can be a light pipe, optical fiber, lens (single element, multiple element, or graded index), or free space that serves as a light transport medium to guide the light to the Disperser 16. The Disperser 16 can shape or distribute the light in a predefined pattern (such as radially uniform) and it may also contain elements, such as phosphors, fluorescent polymers and/or dyes, to change the wavelength of at least some of the incident light. The Separator may also contain light scattering or wavelength converting elements. For instance, it can be a light pipe coated with a phosphor, or fluorescent polymer or dye, to convert at least some of the light before it reaches the Disperser. The lamp enclosure 18 can have a reflective inner surface that reflects light from the Disperser to provide a directional light output. Alternatively, the enclosure can be transparent or semi-transparent, and it can fully surround the lamp elements to provide protection. The inner surface of the lamp enclosure may also contain coatings of dispersion or downconversion materials such as phosphors or fluorescent polymers to downconvert or scatter light from the Disperser.

Figure 2:
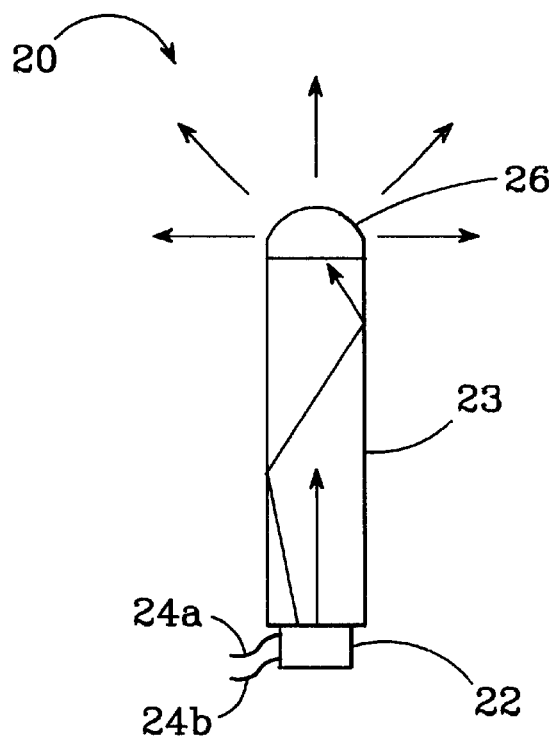
FIG. 2 is a cross-sectional view of the new solid state lamp taken along section lines 2—2 of FIG. 1.

FIG. 2 is a cross-sectional view of one embodiment of the new lamp 10 (without the enclosure) that uses an LED 22 as the light source. The LED is mounted on one end of the Separator 23 such that at least some of its light is directed to the Disperser 26 at the other end. Two leads 24a and 24b are connected to the LED to supply current which excites the LED's active layer and produces light. The Separator 23 comprises either a light pipe or an optical waveguide which guides the light from the LED to the Disperser 26. Light which reaches the Disperser 26 travels down the separator either directly or by reflecting off the Separator's surface. The Disperser 26 preferably has a spherical or hemispherical shape and can either be formed integrally with the Separator, or as a separate component attached to the end of the Separator. The surface of the Disperser can be roughened or frosted to scatter the light into a specified pattern, one example being radial distribution that is useful for room illumination. It may also contain one or more wavelength conversion medium such that the wavelength of at least some of the light is converted, changing the color of the light.

Figure 3A:
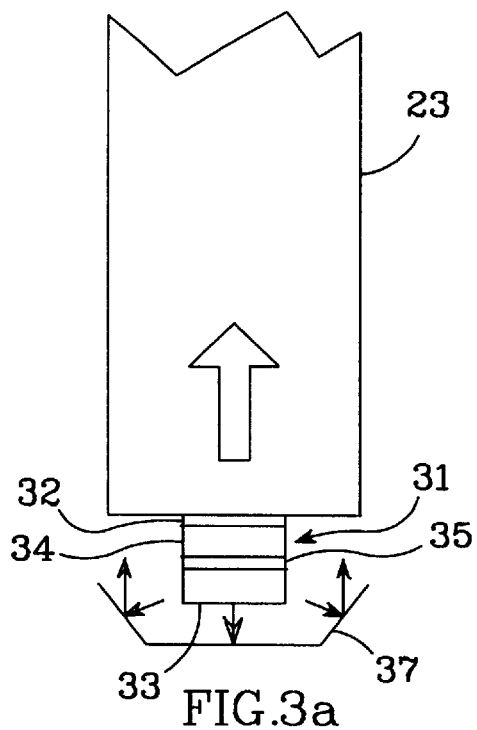
FIGS. 3a through 3g are sectional views of different light sources that can be used with the new solid state lamp.

FIGS. 3a through 3f show various embodiments of the light source constructed in accordance with the invention, although other light sources can also be used. In FIG. 3a the light source is an LED 31 grown on a transparent substrate 32, one example being a nitride-based p-n junction LED (or semiconductor laser) grown on sapphire or silicon carbide substrate. The LED's p-type (or n-type conducting) layer 33 is spaced from the substrate 32, its n-type (or p-type conducting) layer 34 is adjacent to the substrate and the active layer 35 is sandwiched between the p-type and n-type layers. The substrate 32, which is normally considered the "bottom" of the LED, is bonded directly to the end of the Separator 23. Some of the light emitted from the active layer 35 will pass directly through the substrate 32 down the Separator 23. Because the substrate is transparent, it does not absorb the passing light. This embodiment allows for simplified manufacturing by mounting the substrate directly to the Separator and allows for direct access to the p-type layer and n-type layer electrical contacts when both contacts are exposed. A metal cup 37 can be included adjacent to the surface of the p-type layer 33 to reflect light emitted from the p-type surface and the side surfaces, back toward the Separator 23. Alternatively, a metallic or reflective layer can be formed directly on the p-type surface to reflect light back toward the Separator 23.

The LED 31 can be bonded to the separator by many different methods depending on what type of Separator is used. If the Separator is a solid light pipe or optical fiber, the LED 31 can be bonded using an epoxy whose characteristics such as index of refraction, thermal conductivity, electrical resistivity, are compatible with the other components. The epoxy can be restricted to the area between the LED 31 and Separator 23, or the LED 31 can be encased in the epoxy which holds it against the end of the Separator 23. For mechanical attachments, a fluid or solid could be included to better couple the light from the LED into the Separator or to provide a thermal conducting compound to transfer heat away from the LED 31. The mounting method used must allow for an electrical power contact to the LED. Electrical contact and heat sinking of the LED can be achieved by flip-chip bonding the device to a heat sink. To facilitate manufacturing, the Separator may be attached after the LED's electrical and thermal contact are made.

Figure 3B:
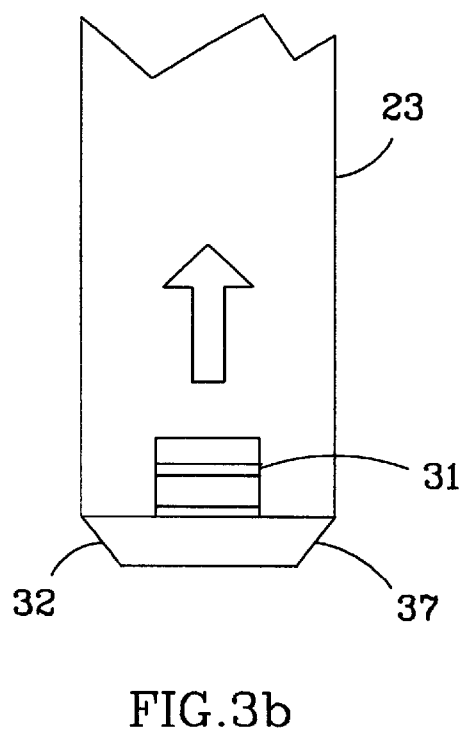

In FIG. 3b the LED 31 (or semiconductor laser) is enclosed within the end of the Separator 23, with a metal cup 37 adjacent to the end of the Separator 23 such that any light emitted from the end of the Separator 23 is reflected back. The substrate 32 is shown as the bottom layer, but the lamp would also work with the device mounted substrate up as described in above in FIG. 3a. When the substrate is mounted up, the metal cup 37 reflects the light emitted from the other LED layers back towards the Separator 23. When the LED 31 is mounted substrate down, the Separator 23 and any light escaping through the substrate of LED side surfaces will be reflected back by the metal cup 37, towards the Separator 23. Alternatively, the LED 31 can have a reflective coating surface placed directly on the p-type layer or substrate surface, depending on which one is down.

Figure 3C:
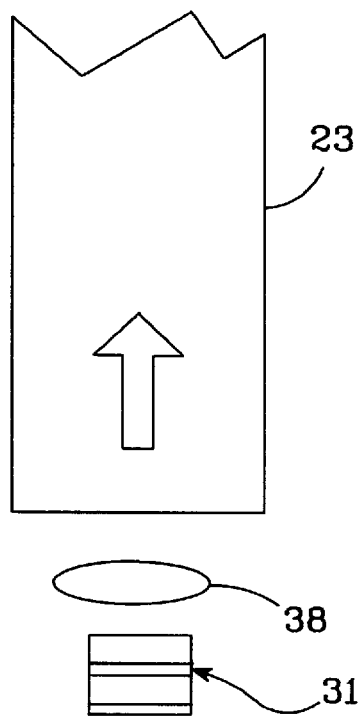

FIG. 3c shows the LED 31 with a lens 38 positioned between the LED and the Separator 23 to focus or guide the LED's light down the Separator; for simplicity the mounting mechanism for the LED and lens is omitted. By focusing the light, more of it can be directed down the Separator and less of the light will be lost between the LED and the Separator 23. Refractive index matching layers can also be provided between the LED and Separator to increase the coupling of light into the Separator 23. Wavelength modifying or filtering material can also be included between the LED and the Separator 23 to convert light emitted be the LED to a different wavelength before it enters the Separator 23.

Figure 3D:
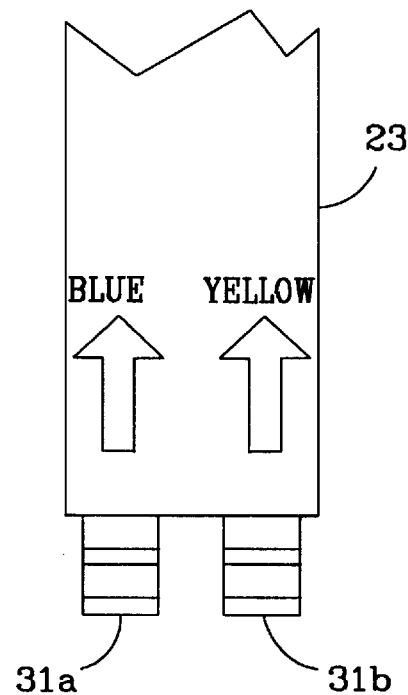

Multiple light emitting devices having similar or different wavelengths can be used as the light source. In FIG. 3d the light source comprises two LEDs 31a and 31b mounted to the end of the Separator 23 with at least some of the LEDs' light directed down the Separator 23. Light from the two LEDs mixes during transmission through the Separator and emission from the Disperser. Blue and yellow LEDs can be used which will combine to produce a white light when emitted from the Disperser. In the case of three different devices, red, green, and blue LEDs can be used which will also combine to produce white light.

Figure 3E:
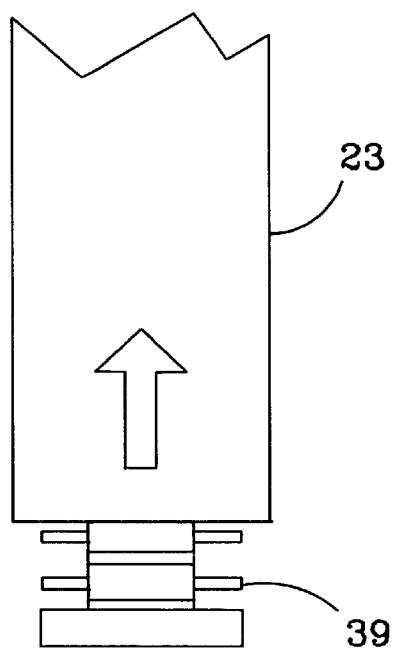
Figure 3F:
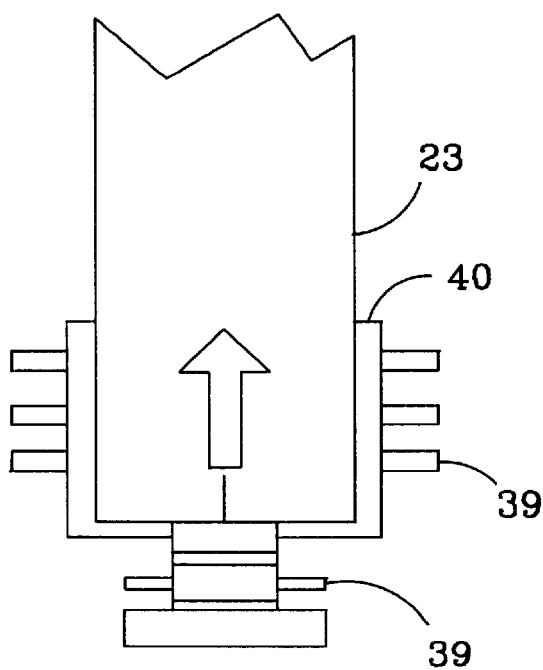

FIGS. 3e and 3f show the LED 31 and Separator 23 with heat sinks for thermal management. As described above, LEDs or solid state lasers that emit an output light flux to be useful for room illumination must carry elevated currents which generate greater heat. The heat sinks shown in FIGS. 3e and 3f comprise "heat fins" 39 that are made of heat conductive material such as metal, although other heat conductive materials can be used. The heat fins draw heat away from the LED 31 and Separator 23 and provide an increased surface area to enhance radiative or convective cooling. This allows for safer high current operation and also increase the lifespan of the LED and lamp. The heat sink shown in FIG. 3e surrounds only the LED; in FIG. 3f the fins 39 of the heat sink surround other parts of the new lamp, such as a portion of the Separator 23. This helps to dissipate heat that might spread from the LED 31 to the Separator 23, particularly in those applications in which the LED 31 is mounted to or in close proximity to the Separator. The heat sink can also include a metal or other thermally conductive layer 40, alone or in conjunction with the fins 38, to facilitate heat transfer away from the LED 31. For instance, a thick copper or aluminum block can be placed underneath the Light Source to transfer heat away from it and the Separator. Heat can also be drawn away from the Light Source by mounting heat pipes to it. Any other attachments that increase the radiative surface area of the heat sink can also be used.

In the preferred embodiment, the dispersion or wavelength conversion materials are located in the Disperser, relatively distant from the LED. This not only protects the wavelength conversion material from the LED's heat, but also allows for other components to be placed close to the light source. For example, electrical circuits or components may be included within the light source for power management (e.g. AC to DC conversion, pulsed operation, or power conversion). The light source may also be housed within a socket or enclosure for mating the new lamp to an electrical power source and/or within thermal management components as described above.

Figure 3G:
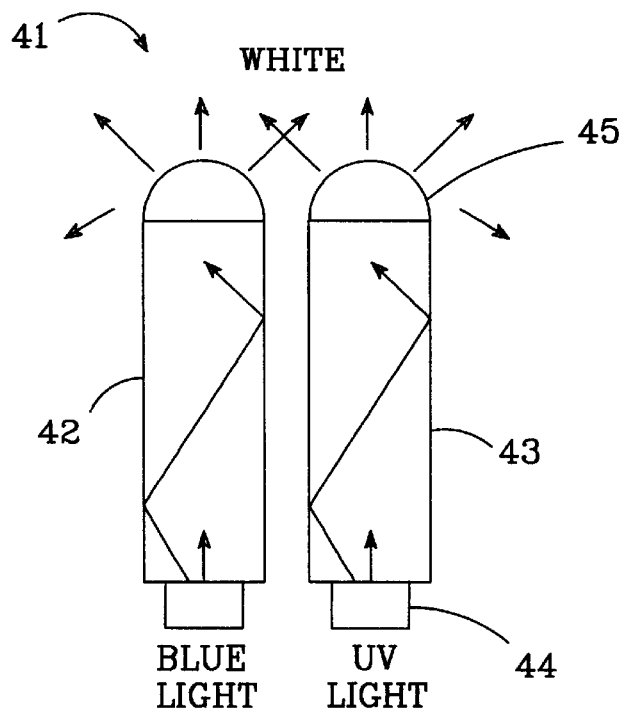

Two or more individual lamps can also be used in parallel in a single multiple element lamp or bulb, which adds flexibility in the patterns and colors of emitted light. FIG. 3g shows a multiple element lamp 41 comprising a blue emitting lamp 42 parallel to a yellow emitting lamp 43. The yellow light is produced by converting nearly all the light from a UV light 44 to yellow using a phosphor, polymer, or dye in the Disperser 45 (as more fully described below). The yellow and blue light from lamps 42 and 43 will mix to produce a white light from the lamp 41. This embodiment provides flexibility in the ratio of blue to yellow light, providing a wider range of white lighting. This embodiment can also have three individual lamps, each with a UV light source that is converted to red, green, or blue light as the light passed through the respective Disperser. Also, if red and green individual lamps are used in combination in multiple element lamp or bulb, the color and hue of the light can be manipulated by adjusting the input power to each individual lamp. For instance, a "warmer" white light will be emitted by increasing the power to the red lamp, increasing its light emitting intensity. This can be extended to achieve a full range of colors from one lamp or bulb by controlling the input power to the individual lamps that comprise the lamp or bulb. This approach can also be used in the same way with one or more Light Sources (generating light at different wavelengths) whose light is directed down a single Separator to a Disperser. The colors can be changed by manipulating the power input to the different Light Sources.

The Separator 23 serves primarily to separate the light source from the Disperser 26. It can be any elongated hollow or transparent element or tube of any variety of geometries through which light may travel. It can be passive and not affect the light as it travels from the light source to the Disperser. Passive Separators include, but are not limited to, hollow tubes or offset rods which serve only to provide physical separation.

Alternatively, the Separator can be a light pipe or optical fiber which can actively shape, collimate, wavelength convert, disperse, scatter, redirect, and/or guide some or all of the light between the light source and the Disperser. In one active Separator embodiment using an LED light source, the Separator may convert the wavelength of at least some of the light with the amount of conversion increasing with the Separator's length. It can also contain optical elements such as mirrors, facets, or sections with different indexes of refraction to focus, shape, scatter or redirect the light.

The Separator ranges from a few microns to greater than one meter in length, with the preferred length for room illumination being in the range of 5–10 cm. The width of the Separator can range from 1 micron to over 1 cm.

FIG. 4 shows another embodiment of the new lamp 46 that can be used with many light sources, but is particularly applicable to coherent/collimated light sources such as solid state semiconductor lasers 47. Because the light from the laser is coherent, the light can be collimated with a simple optical element at the source end, and the Separator need only provide a physical separation between the light source and the Disperser. The separation is provided by one or more parallel offset rods 48a and 48b having the laser 47 mounted at one end and the Disperser 49 mounted at the other end. The rods 48a and 48b are offset so they will not interfere with the light as it passes from the light source to the Disperser. The laser 47 can be mounted directly on the rods, or it can be affixed to a transparent retainer 50 which is then mounted to the rods. A hollow tube can also be used with a laser mounted at one end and the Disperser mounted at the other. To provide both lensing and a high numerical separator, a graded index rod or light pipe can be used as the Separator.

In operation the coherent light travels in ambient air from the laser 47 to the Disperser 49, where it is distributed in the desired color and pattern. With some lasers, the light may be too collimated to be effectively dispersed and the Separator can include optics or gratings to spread the light before it reaches the Disperser. An example of such a beam spreading system is a double lens beam expander.

One of the advantages of the new lamp 46 is that it can change the color of light from the light source and can mix the light from one or more lasers or other sources which emit different colors of light. For example, red, green and blue lasers can be mounted to one end of the offset rods (or other Separator) with their collimated beams directed to the Disperser, where the light mixes and is emitted from the Disperser as white light. Alternatively, an ultraviolet laser can be used and the Disperser provided with red, blue, and green (or yellow) phosphors, polymers, or dyes, which convert some of the UV light to blue, red, and some to green (or yellow). Alternatively, by using a blue laser, interspersing yellow phosphors, polymers, or dyes, on or within the Disperser and including clear areas for the passaged of blue light between phosphors, optimal portions of blue and yellow light can be obtained and combined into a white light output. By using a different Separator, LEDs can also be used to create white light in the same way.

The new lamp 46 is also particularly applicable to traffic signals. The new traffic signal would comprise three UV lasers, each having a respective Separator and Disperser. Each Disperser would contain a different downconverting material that downconverts the UV light to a different wavelength, one downconverting it to green light, one to yellow, and one to red. The Disperser would also scatter the collimated light from the respective laser so that the light would be dispersed similar to a standard traffic signal. Alternatively, the Disperser could focus and direct the light so that it is primarily visible to the appropriate lanes of traffic. The light source for the new traffic signal would be more robust, reliable and longer lasting, comprising three UV lasers, as opposed to tungsten based lamps or complex LED arrays.

Figure 5D:
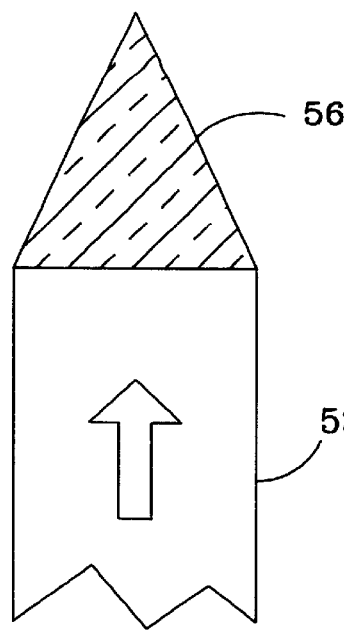

FIGS. 5a through 5e show various embodiments of the Disperser, although other designs could also be used. FIG. 5a shows a Disperser 51 which is integrated with the end of a Separator 52. In this embodiment, the Separator consists of an solid optical fiber or light pipe, and the Disperser 51 is formed as a ground or polished end of the Separator 52. It can also be roughened or frosted to further scatter light passing through it. For even greater flexibility, the Disperser can focus light into a beam or other desired pattern. It can be a frosted or roughened hemisphere to provide a radial, near spherical light distribution similar to a standard tungsten based light bulb. Alternatively, the Disperser 51 can be a separate optical component attached to the end of the Separator 52. It can be removable, allowing for different Dispersers to be used with the same lamp and for the Disperser to be replaced if it fails before the rest of the lamp.

The Disperser may include materials such as fluorescent phosphors, minerals, polymers, dyes, crystals or thin films, which convert the incident light partially or fully to different wavelengths. The Disperser can also comprise a hollow shell of transparent or translucent material such as quartz, glass, or the like, which contains the downconverting material in solid or liquid form. Alternatively, the Disperser can comprise a solid body, which contains the downconverting material in solution or suspension. For instance, it can be a molded epoxy with phosphor particles uniformly dispersed throughout prior to solidification or with fluorescent dyes dissolved within it. As another alternative, the Disperser could comprise a solid body, the outside or inside surface of which has been coated by a downconverting material.

In FIG. 5b, the light source produces a blue light having a wavelength of 420 to 500 nanometers (nm), and the Separator 52 is an optical fiber or light pipe which transports most of the blue light to the Disperser 53. The Disperser 53 includes one or more wavelength converting material such as yellow phosphor which allows some of the blue incident light to pass through while absorbing the rest, downconverting its wavelength, and emitting it as yellow light with a center wavelength of 560 to 580 nm. The blue and yellow light combine as they emit from the Disperser to produce white. Depending upon the details (shape, optical elements, etc.) of the Disperser 53, the white light will emit in a spherical, nearly spherical, hemispherical or any other specified distribution pattern. Similarly, the Disperser 53 could also be designed such that most or all the light incident from the light source is converted to multiple colors and uniformly emitted, as in the case of a UV LED or laser used in combination with red, green, and blue emitting phosphors, polymers, or dyes.

Figure 5C:
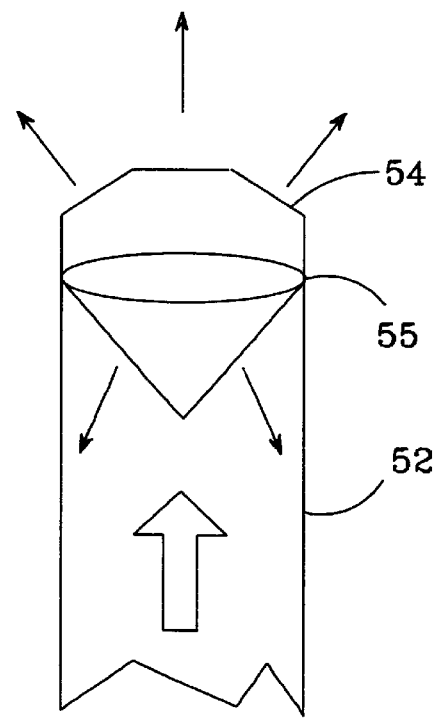

The Disperser 54 in FIG. 5c includes a lower portion 55 which scatters some to the light into a desired shape or pattern. Alternatively, the Disperser 54 can include other optical components, such as lenses, facets, fresnel lenses, holographic elements, reflectors, partial reflectors, masks, and granules, which shape the light into specified patterns. A mask or reflector can also provide a more directional or controlled light distribution for pre-defined patterns of illumination such as a company logo or sign. In some cases, an intentionally non-uniform distribution of light may be desired so that the lamp appears to emit different colors when viewed from different angles. This can be used in a novelty light or to project a specified pattern of illumination and color into a surface or the surrounding environment.

FIG. 5d shows a conical shaped Disperser 56 which disperses the light into a spherical or nearly spherical pre-defined pattern. The conical shape places a greater amount of scattering or downconverting material in the path of the light compared to a hemispherical shaped Disperser.

Figure 5E:
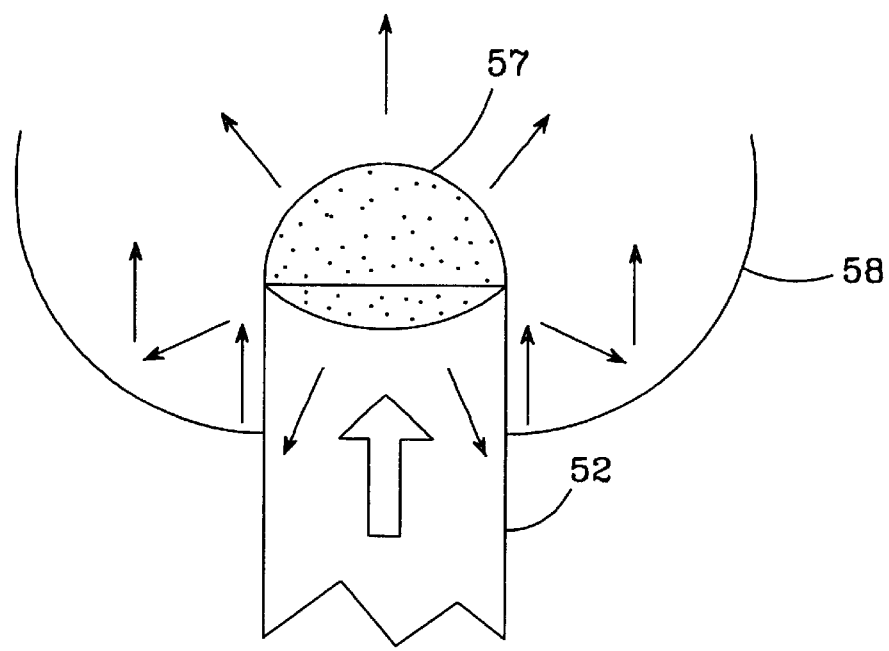

FIG. 5e shows a Disperser 57 similar to the one in FIG. 5b, with a reflector 58 around the Disperser 58 which reflects and redirects some of the light emitted from the Disperser. This embodiment can be used in applications requiring a directional light, such as indicator lights and flashlights. Light emitted from the Disperser 58 laterally or backwards toward the light source is reflected out by the reflector. This allows for a directional beam while still keeping the wavelength conversion materials separate from the light source, preventing heat damage to the conversion material.

A lamp enclosure can be included that either fully or partially surrounds the new lamp. The enclosure may be transparent or semitransparent and it may incorporate additional elements to modify the intensity, distribution or wavelength of the light which it transmits. It can also include elements for electrical and/or thermal contact to the lamp (e.g. a conventional light bulb socket), and to enhance the thermal dissipation from the lamp assembly.

Figure 6A:
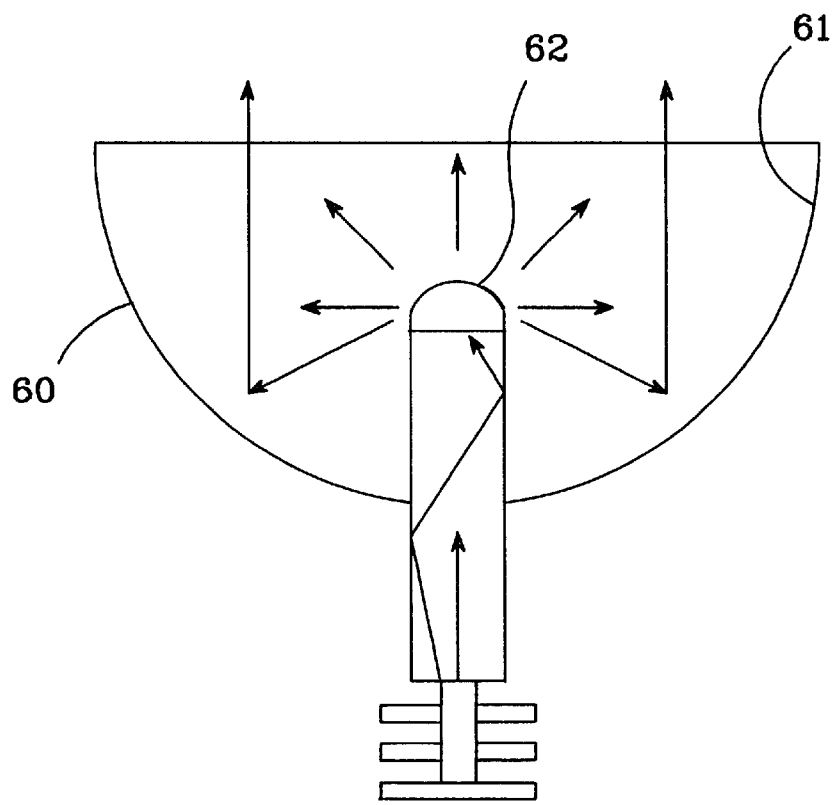
FIGS. 6a and 6b are sectional views of the new lamp with two different lamp enclosures.
Figure 6B:
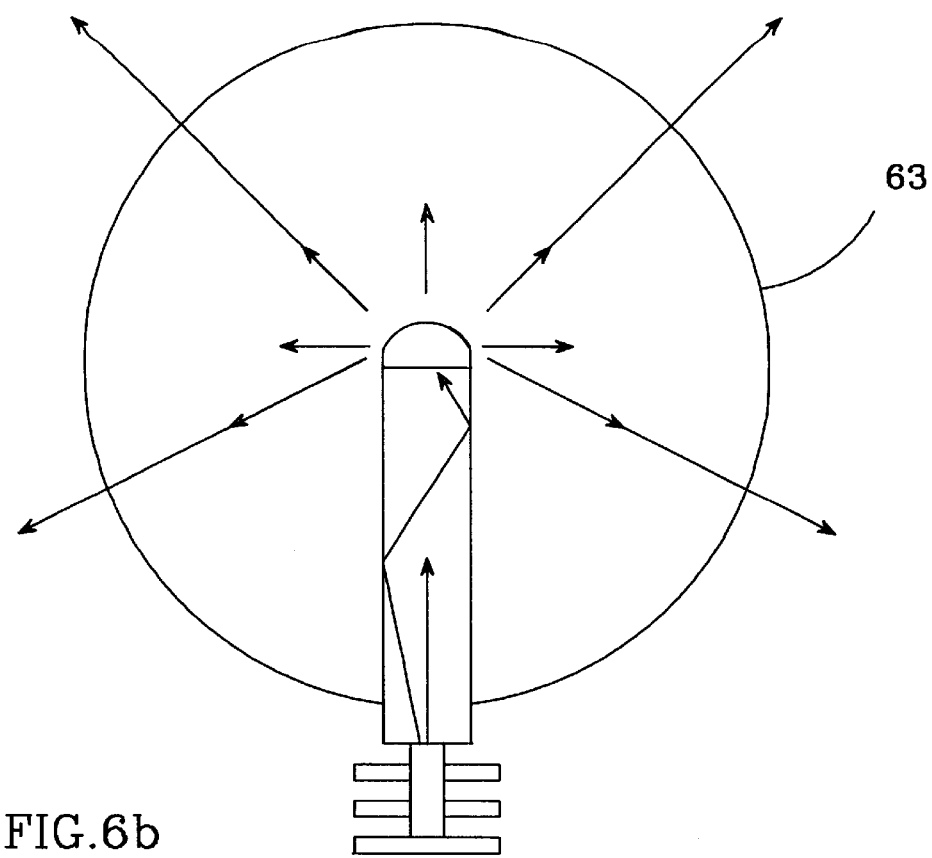

FIGS. 6a and 6b show two embodiments of lamp enclosures. The enclosure 60 in FIG. 6a is an inner reflective surface 61 similar to that described in FIG. 5e; light from the Disperser 62 which strikes the reflective surface is directed out as a directional beam. The lamp enclosure 60 also provides some protection to the various lamp elements. The enclosure 63 shown in FIG. 6b surrounds the elements of the new lamp for protection, and is transparent or semi-transparent to allow light to pass through. The enclosure can be made of many different materials such as glass or plastic, and can include materials to modify or down convert the light. For instance, the lamp can emit blue light and the enclosure 62 include yellow phosphors that convert a portion of the blue light to yellow and allow some of the blue light to pass through, with the two colors combining to white. The enclosure can also be filled with a liquid, gas, or solid which changes the wavelength or properties of the light after it has been emitted from the Disperser.

Although the present invention has been described in considerable detail with reference to certain preferred configurations thereof, other versions are possible. Therefore, the spirit and scope of the appended claims should not be limited to their preferred versions contained therein.

We claim:

1. A lamp, comprising:
    a light source;
    a disperser that scatters, focuses, or directs light passing through it; and
    a separator having two ends, said light source disposed at one of said two ends and said disperser disposed at the other of said two ends, at least some of the light from said light source directed along said separator and through said disperser.

2. The lamp of claim 1, wherein said disperser scatters light in a predefined pattern.

3. The lamp of claim 1, wherein said disperser scatters light in a spherical pattern.

4. The lamp of claim 1, wherein said disperser contains material to change the wavelength of at least some of the light passing through it.

5. The lamp of claim 1, wherein said light source is at least one light emitting diode or at least one laser.

6. The lamp of claim 1, wherein said separator spaces said light source and disperser a sufficient distance to prevent substantial heat transfer from said light source to said disperser.

7. The lamp of claim 1, wherein said light source emits an output light flux sufficient for illumination.

8. The lamp of claim 1, further comprising an at least partially transparent substantially spherical and hollow enclosure surrounding said light source, separator, and disperser.

9. The lamp of claim 8, wherein said enclosure changes the wavelength of at least some of the light from said light source.

10. The lamp of claim 8, wherein said enclosure disperses light from said light source.

11. The lamp of claim 1, further comprising a reflective lamp enclosure, said disperser positioned within said lamp enclosure such that at least some of the light from said disperser reflects off said lamp enclosure as a directional beam.

12. The lamp of claim 1, wherein said separator scatters, disperses, redirects, or wavelength-converts at least some of said light from said light source.

13. The lamp of claim 4, wherein said light source is an LED or laser that emits blue light and said disperser converts the wavelength of some of said blue light to yellow light, whereby said disperser emits a white light combination of blue and yellow.

14. The lamp of claim 13, wherein said disperser includes at least one of said yellow emitting phosphor, fluorescent dye, or fluorescent polymer to produce said wavelength conversion.

15. The lamp of claim 4, wherein said light source is a LED or laser emitting light of one wavelength, said disperser converting substantially all of the light to one or more different wavelengths.

16. The lamp of claim 4, wherein said light source emits ultraviolet light, said disperser converting substantially all of the ultraviolet light to colors that combine to produce white light.

17. The lamp of claim 1, further comprising a heat sink around said light source to draw away heat generated by said light source.

18. The lamp of claim 1, wherein said disperser further comprises at least one optical element to shape the light passing through it.

19. The lamp of claim 1, wherein said disperser further comprises at least one mask or other patterned surface to shape the light emitted from said disperser.

20. The lamp of claim 1, wherein said disperser further comprises at least one of the materials from the group consisting of fluorescent phosphors, minerals, polymers, dyes, crystals and thin films.

21. A lamp, comprising:
a light source;
a disperser that mixes and disperses light passing through it; and
a separator having two ends, said light source disposed at one of said two ends and said disperser disposed at the other of said two ends, said light source and disperser spaced apart by said separator a sufficient distance to prevent substantial heat transfer from said light source to said disperser, at least some of the light from said light source directed along said separator and through said disperser.

22. The lamp of claim 21, wherein said light source comprises at least one light emitting diode.

23. The lamp of claim 21, wherein said light source comprises at least one laser.

24. The lamp of claim 21, wherein said light source comprises at least two light emitting diodes (LEDs), the light from said diodes mixing in said separator and disperser such that said lamp emits a combination of light from said LEDs.

25. The lamp of claim 24, wherein a current is respectively applied to said LEDs causing them to emit light, said respective currents manipulated to control the combination of light emitted from said lamp.

26. The lamp of claim 21, wherein said light source emits blue and yellow light, said disperser emitting a white light combination of blue and yellow.

27. The lamp of claim 21, wherein said light source emits red, green, and blue light, said disperser emitting a white light combination of red, green, and blue.

28. The lamp of claim 21, further comprising an at least partially transparent hollow enclosure surrounding said light source, separator, and disperser.

29. The lamp of claim 28, wherein said enclosure scatters light from said light source.

30. The lamp of claim 21, wherein said enclosure changes the wavelength of at least some of the light from said light source.

31. The lamp of claim 21, further comprising a reflective lamp enclosure, said disperser positioned within said lamp enclosure such that at least some of the light from said disperser reflects off said lamp enclosure as a directional beam.

32. The lamp of claim 21, further comprising a heat sink around said light source to draw away heat generated by said light source.

33. The lamp of claim 21, wherein said disperser contains optical elements to shape the light emitting from said disperser.

34. The lamp of claim 21, wherein said disperser contains at least one mask to shape the light emitted from said disperser.

35. A lamp, comprising:
a light source comprising at least one solid state laser;
a disperser that mixes and disperses light passing through it; and
a separator comprising having two ends, said light source mounted at one of said two ends and said disperser mounted on the other of said two ends, said light source and disperser spaced apart by said separator, at least some of the light from said light source directed through said disperser.

36. The lamp of claim 35, wherein said separator comprises one or more offset rods.

37. The lamp of claim 35, wherein said separator comprises a hollow tube.

38. The lamp of claim 35, wherein said solid state laser emits an output light flux sufficient for room illumination.

39. A lamp, comprising:
a light source comprising at least one light emitting diode that emits an output light flux sufficient for room illumination;
a disperser that disperses light passing through it;
a separator having two ends, said light source mounted at one of said two ends and said disperser mounted at the other of said two ends, said light source and disperser spaced apart by said separator a sufficient distance to prevent substantial heat transfer from said light source to said disperser, at least some of the light from said light source directed along said separator and through said disperser;
a hollow lamp enclosure that is a least partially transparent and containing materials to change the wavelength of at least some of the light which passes through it, said enclosure surrounding said light source, separator and disperser such that light dispersed by said disperser passes through said enclosure.

40. The lamp of claim 39, wherein said light source is a blue light emitting diode or laser and said lamp enclosure includes a wavelength converting material which changes some of said blue light to yellow light, whereby said disperser emits a white light combination of blue and yellow.

41. The lamp of claim 39, wherein said enclosure, disperser, or separator includes yellow phosphor to produce said wavelength conversion.

42. The lamp of claim 39, wherein said enclosure, disperser, or separator includes a fluorescent dye or polymer to produce said wavelength conversion.

43. The lamp of claim 39, wherein said light source is an ultraviolet light emitting diode or laser, said lamp enclosure, disperser, or separator includes a wavelength converting material which converts substantially all of the ultraviolet light to colors which combine to produce colored or white light.

44. A multiple element lamp, comprising:
   at least two individual lamps whose light mixes to produce the light from said multiple element lamp, each said individual lamp comprising:
      a light source;
      a disperser that scatters, focuses, or directs light passing through it; and
      an elongated separator having two ends, said light source disposed at one of said two ends and said disperser disposed at the other of said two ends, at least some of the light from said light source directed along said separator and through said disperser.

45. The lamp of claim 44, having two said individual lamps wherein one of said two individual lamp emits blue light and the other of said two individual lamp emits yellow light such that said lamp emits white light.

46. The lamp of claim 44, having three individual lamps, emitting red, green, and blue light, said multiple element lamp emitting a white light combination of red, green, and blue.

47. The lamp of claim 44, wherein a current is applied to each said individual lamp causing them to emit light, the current applied to said individual lamps manipulated to control the color of light emitted from said multiple element lamp.

48. A method for producing dispersed light, comprising:

generating light at a first location;

transmitting at least some of the light to another location which is out of substantial heat transfer communication with said first location; and scattering or converting the wavelength of some of the light at said other location, and dispersing all of the light.

49. The lamp of claim 1, wherein said disperser is removably mounted to said separator.

50. The lamp of claim 1, wherein said separator is an elongated hollow or at least partially transparent element through which light can travel.

51. The lamp of claim 1, wherein said light source is at least two separate light sources, the light from said at least two light sources mixing in said separator and said disperser, the intensity of light emitted from said two separate light sources being controllable to control the color of light emitted from said lamp.

52. The lamp of claim 21, wherein said disperser is removably mounted to said separator.

53. The lamp of claim 21, wherein said separator is an elongated hollow or at least partially transparent element through which light can travel.

\* \* \* \* \*